(12) United States Patent
Namai

(10) Patent No.: US 8,968,586 B2
(45) Date of Patent: Mar. 3, 2015

(54) PATTERN-FORMING METHOD

(75) Inventor: Hayato Namai, Tokyo (JP)

(73) Assignee: JSR Corporation, Tokyo (JP)

( * ) Notice: Subject to any disclaimer, the term of this patent is extended or adjusted under 35 U.S.C. 154(b) by 55 days.

(21) Appl. No.: 13/397,017

(22) Filed: Feb. 15, 2012

(65) Prior Publication Data
US 2013/0206727 A1 Aug. 15, 2013

(51) Int. Cl.
B44C 1/22 (2006.01)

(52) U.S. Cl.
USPC ............ 216/41; 216/83; 430/423; 430/425

(58) Field of Classification Search
CPC ....... G03F 7/40; G03F 7/405; H01L 21/0273; B44C 1/22
USPC .................. 216/41, 83; 430/325, 423
See application file for complete search history.

(56) References Cited

U.S. PATENT DOCUMENTS

| | | | |
|---|---|---|---|
| 4,491,628 A | 1/1985 | Ito et al. | |
| 7,745,093 B2 * | 6/2010 | Nishibe et al. | 430/270.1 |
| 2007/0112106 A1 * | 5/2007 | Otsuki | 524/114 |
| 2007/0128559 A1 * | 6/2007 | Ishibashi et al. | 430/330 |
| 2009/0126855 A1 * | 5/2009 | Sugeta et al. | 156/85 |
| 2010/0248167 A1 * | 9/2010 | Konno | 430/326 |
| 2010/0255430 A1 | 10/2010 | Dammel et al. | |
| 2011/0155649 A1 * | 6/2011 | Mazur et al. | 209/3 |
| 2012/0028195 A1 * | 2/2012 | Wu et al. | 430/323 |
| 2012/0100488 A1 * | 4/2012 | Kozawa et al. | 430/423 |

FOREIGN PATENT DOCUMENTS

| | | |
|---|---|---|
| JP | 59-045439 | 3/1984 |
| JP | 05-166717 | 7/1993 |
| JP | 09-090637 | 4/1997 |
| JP | 10-073927 | 3/1998 |
| JP | 10-274852 | 10/1998 |
| JP | 2000-026446 | 1/2000 |
| JP | 2001-100428 | 4/2001 |
| JP | 2002-006512 | 1/2002 |
| JP | 2004-191465 | 7/2004 |
| JP | 2009-196944 | 9/2009 |

OTHER PUBLICATIONS

International Search Report for corresponding International Application No. PCT/JP2013/000855, May 7, 2013.
Written Opinion for corresponding International Application No. PCT/JP2013/000855, May 7, 2013.

* cited by examiner

Primary Examiner — Shamim Ahmed
(74) Attorney, Agent, or Firm — Oblon, Spivak, McClelland, Maier & Neustadt, L.L.P.

(57) ABSTRACT

A pattern-forming method includes forming a prepattern on a substrate. A space other than a space in which the prepattern is formed on the substrate is filled with a resin composition containing a compound which is diffusible into the prepattern. The compound is diffused into a part of the prepattern. Portions in which the compound is undiffused in the prepattern are removed using a removing liquid.

8 Claims, 2 Drawing Sheets

PATTERN-FORMING METHOD

BACKGROUND OF THE INVENTION

1. Field of the Invention

The present invention relates to a pattern-forming method.

2. Discussion of the Background

As miniaturization of various types of electronic device structures such as semiconductor devices and liquid crystal devices proceeds, finer patterning in lithography techniques has been demanded. For the present, formation of fine patterns with a line width of about 90 nm is enabled using for example, an ArF excimer laser; however, still finer pattern formation will be hereafter required.

Conventionally, pattern-forming methods in which a chemical amplification type resist composition is used have been extensively employed for forming such fine patterns. The chemical amplification type resist composition contains an acid generating component that generates an acid upon exposure to light, and further a resin component that has solubility in developing solutions which is to be changed by an action of this acid (see, JP-A No. S59-45439), and is capable of forming patterns using the difference the rate of dissolution of a light-exposed site and that of a light-unexposed site. A variety of compositions have been developed as the chemical amplification type resist composition such as radiation sensitive compositions containing a lactone-containing (meth)acrylic polymer (see, JP-A Nos. H9-90637, H10-274852, 2000-26446 and 2009-196944), radiation sensitive compositions containing a acrylic acid ester derivative having a cyclic sulfonyl structure (see, JP-A No. 2009-196944), and the like.

SUMMARY OF THE INVENTION

According to one aspect of the present invention, a pattern-forming method includes forming a prepattern on a substrate. A space other than a space in which the prepattern is formed on the substrate is filled with a resin composition containing a compound which is diffusible into the prepattern. The compound is diffused into a part of the prepattern. Portions in which the compound is undiffused in the prepattern are removed using a removing liquid.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
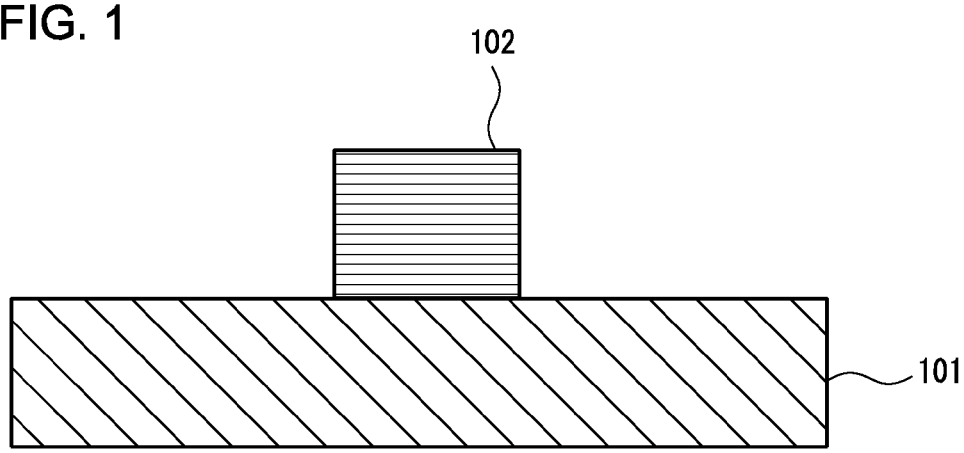
FIG. 1 shows a schematic view illustrating an example of a state achieved after forming a prepattern on a substrate according to the pattern-forming method of the embodiment of the present invention.

An embodiment of the present invention is directed to a pattern-forming method including:

(1) forming a prepattern on a substrate (hereinafter, may be also referred to as "step (1)");

(2) filling an area other than the prepattern on the substrate with a resin composition containing a compound (a) that is diffusible into the prepattern (hereinafter, may be also referred to as "resin composition (A)") (hereinafter, the step may be also referred to as "step (2)");

(3) diffusing into a part of the prepattern the compound (a) in the filling resin composition (hereinafter, may be also referred to as "step (3)"); and (4) removing portions in which the compound (a) is undiffused in the prepattern with a removing liquid (hereinafter, may be also referred to as "step (4)").

According to the pattern-forming method of the embodiment of the present invention, diffusion into the prepattern of the compound (a) contained in the resin composition (A) enables the solubility of the prepattern in the developing solution to be changed. When a removing liquid capable of dissolving the portions in which the compound (a) is undiffused in the prepattern is used, the portions of the resin composition (A), and the portions in which the compound (a) is diffused in the prepattern are selectively left, and thus other portions, i.e., portions in which the compound (a) is undiffused in the prepattern can be removed. Accordingly, formation of a fine pattern composed of grooves having smaller widths than that of the prepattern is enabled.

The removing liquid used in the step (4) is preferably an alkaline aqueous solution. When the removing liquid is an alkaline aqueous solution, as the prepattern any resin composition containing a polymer having a highly polar group such as a carboxy group may be used. Such a prepattern may be formed by, for example, a negative type pattern-forming method in which development with an organic solvent is employed, or a positive type pattern-forming method with an alkaline developing solution are subjected to a treatment such as irradiation with a radioactive ray, heating, etc. Since ArF excimer laser or the like may be used, and formation of fine patterns is enabled in these methods of forming prepatterns, patterns finally obtained by the present pattern-forming method can be still finer.

The removing liquid used in the step (4) preferably contains an organic solvent. When the removing liquid thus contains an organic solvent, the prepattern may include a polymer having a group with less polarity. Since such prepatterns can be formed by, for example, a positive type pattern-forming method with an alkaline developing solution, formation of fine patterns using an ArF excimer laser or the like is enabled. Therefore, patterns finally obtained by the present pattern-forming method can be still finer.

In the step (3), the diffusion of the compound (a) is preferably executed by heating. Since heating increases a diffusion velocity of the compound (a) into the prepattern, a finer pattern can be efficiently formed according to the embodiment of the present pattern-forming method.

The compound (a) has a weight average molecular weight of preferably 20,000 or less. When the compound (a) has the aforementioned particular size or less, the efficiency of diffusion into the prepattern can be improved. As a result, formation of a finer pattern is enabled according to the embodiment of the present pattern-forming method.

The ratio of the weight average molecular weight to the number average molecular weight of the compound (a) is preferably 1.5 or less. When the ratio of the weight average molecular weight to the number average molecular weight of the compound (a) is 1.5 or less, i.e., when the molecule size of the compound (a) does not vary widely, the velocity of the diffusion of the compound (a) into the prepattern becomes uniform. As a result, formation of a fine pattern that is superior in pattern configuration is enabled according to the present pattern-forming method.

The compound (a) is preferably at least one compound selected from the group consisting of a silsesquioxane compound, a polystyrene compound and a (meth)acrylic compound. Since the aforementioned particular compounds are superior in efficiency of diffusion into a prepattern, a still finer pattern can be efficiently formed according to the embodiment of the present pattern-forming method.

The aforementioned prepattern is preferably a line-and-space pattern or a pillar pattern. When the prepattern is a line-and-space pattern or a pillar pattern in the present pattern-forming method of the embodiment of the present invention, a finer pattern can be formed accurately and efficiently.

According to a novel pattern-forming method of the embodiment of the present invention, formation of patterns still finer than patterns obtainable using a conventional pattern-forming method is enabled. Therefore, the pattern-forming method of the embodiment of the present invention can be suitably used for forming resist patterns in lithography process of various types of electronic devices such as semiconductor devices, liquid crystal devices, etc., that necessitate further miniaturization.

The embodiments will now be described with reference to the accompanying drawings, wherein like reference numerals designate corresponding or identical elements throughout the various drawings.

Pattern-Forming Method

The pattern-forming method of the embodiment of the present invention includes (1) forming a prepattern on a substrate;

(2) filling an area other than a space in which the prepattern is formed on the substrate with a resin composition (A) containing a compound (a) which is diffusible into the prepattern;

(3) diffusing into a part of the prepattern the compound (a) in the filling resin composition (A); and (4) removing portions in which the compound (a) is undiffused in the prepattern with a removing liquid. Hereinafter, each step is explained with reference to FIGS. 1 to 4.

Step (1)

As shown in FIG. 1, a prepattern 102 is formed on a substrate 101 using a composition for prepattern formation in the step (1). In the step (2) described later, a space 103 other than a space in which the prepattern 102 is filled with a resin composition (A) containing a compound (a), and in the step (3) the compound (a) is diffused into a part of the prepattern 102 from the resin composition (A). In the prepattern 102, portions 104 in which the compound (a) is diffused and undiffused portion 105 have different solubilities in a removing liquid used in the step (4).

More specifically, in the prepattern 102, portions 104 in which the compound (a) is diffused exhibit an insoluble or hardly soluble property in the removing liquid similarly to the resin composition (A), whereas portion 105 in which the compound (a) is undiffused exhibit a highly soluble property in the removing liquid. Therefore, by carrying out a treatment with the removing liquid, only the portion 105 in which the compound (a) is undiffused in the prepattern is dissolved, and thus a fine pattern having a pattern width smaller than that of the prepattern can be formed. Therefore, it is necessary to use a composition that is insoluble or hardly soluble in the removing liquid as the composition for prepattern formation, and the composition may be selected appropriately to meet the removing liquid employed.

A conventionally well-known substrate such as, for example, a silicon wafer or an aluminum-coated wafer may be used as the substrate 101.

A method similar to well-known methods for forming a resist pattern may be used as the method for forming the prepattern 102, which may be either a positive type pattern-forming method, or a negative type pattern-forming method. Also, a conventional composition for forming a resist film containing a polymer having an acid-dissociable group, an acid generator and the like may be used as the composition for prepattern formation, but it is necessary to use a composition that dissolves in the removing liquid used in the step (4), as described above. In a specific method for forming the prepattern 102, a chemical amplification type resist composition such as, for example, ARX2928JN (manufactured by JSR Corporation) is applied onto the substrate 101 to form a resist film. Next, a radioactive ray is irradiated to a desired area of the resist film through a mask having a specified pattern. Liquid immersion lithography may be carried out as needed. Examples of the radioactive ray include ultraviolet rays, deep ultraviolet rays, X-rays, charged particle rays, and the like. Of these, deep ultraviolet rays typified by ArF excimer laser light and KrF excimer laser light are preferred, and ArF excimer laser light is more preferred. Subsequently, post-exposure bake (PEB) is performed, and a desired prepattern 102 can be formed following development carried out using a developing solution such as an organic solvent-containing developing solution or an alkaline developing solution.

When the negative type pattern-forming method is employed, for example, if the development is carried out using, for example, a developing solution containing an organic solvent, to leave a highly polar light-exposed site as a prepattern, the step (2) may be carried out without particularly conducting a post treatment or the like. However, it is necessary to fill the area other than the prepattern with the resin composition (A) containing the compound (a) that is insoluble or hardly soluble in an alkaline aqueous solution in the step (2).

To the contrary, when the positive type pattern-forming method is employed, in other words, when the development is carried out using an alkaline developing solution to leave a less polar light-unexposed site as a prepattern, an appropriate process among the following two processes may be selected ad libitum. In the first process, a less polar pattern which was left after the development is changed to a highly polar pattern by subjecting to irradiation with a radioactive ray, heating, etc., and thereafter the step (2) is carried out. Also in this case, it is necessary to fill the area other than the prepattern with the resin composition (A) containing the compound (a) that is insoluble or hardly soluble in an alkaline aqueous solution in the step (2). In the second process, the step (2) is carried out on a less polar pattern which was left after the development, without particularly subjecting to a post treatment or the like. However, in the step (2), it is necessary to fill the area other than the prepattern with the resin composition (A) containing the compound (a) that is insoluble or hardly soluble in an organic solvent used in the step (4).

Although the prepattern is not particularly limited, a line-and-space pattern, or a pillar pattern is preferred. According to the present pattern-forming method, when a line-and-space pattern is employed as the prepattern, a trench pattern having a width smaller than the line width can be obtained, whereas when a pillar pattern is employed as the prepattern, a finer hole pattern can be obtained.

It is to be noted that on the substrate 101 may be formed an underlayer film having an anti-reflective function against radioactive rays, etc., and the prepattern may be formed on the underlayer film. Although the process for forming the underlayer film is not particularly limited, for example, the underlayer film may be formed by application on the substrate 101 with a well-known technique such as spin coating to form a coating, which is then cured by exposure and/or heating. Examples of the radioactive ray which may be used in the exposure include visible light rays, ultraviolet rays, deep ultraviolet rays, X-rays, electron beams, γ-rays, molecular beams, ion beams, and the like. Although the heating temperature of the coating is not particularly limited, it is preferably 90 to 550° C., more preferably 90 to 450° C., and still more preferably 90 to 300° C. Also, the film thickness of the underlayer film is not particularly limited, but is preferably 50 to 20,000 nm, and more preferably 70 to 1,000 nm.

Step (2)

Figure 2:
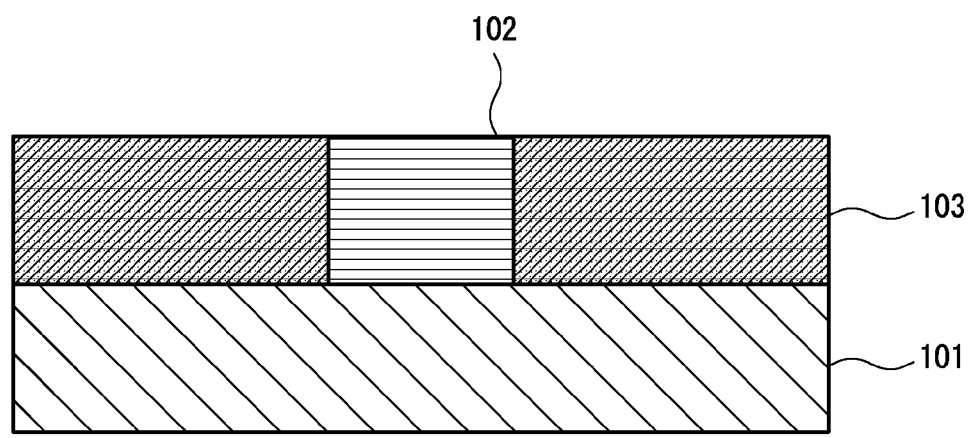
FIG. 2 shows a schematic view illustrating an example of a state achieved after filling an area other than the prepattern on the substrate with a resin composition (A) according to the pattern-forming method of the embodiment of the present invention.
Figure 3:
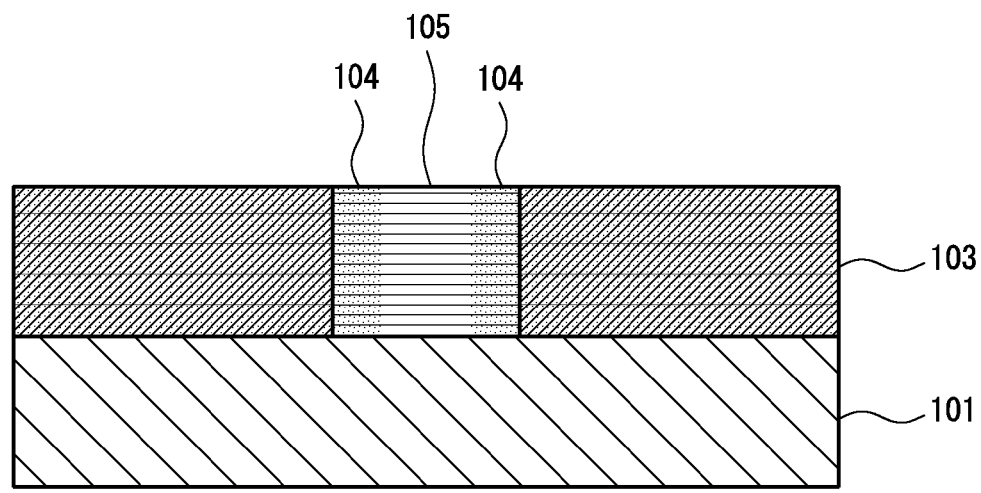
FIG. 3 shows a schematic view illustrating an example of a state achieved after allowing the compound (a) in the resin composition (A) to be diffused into the prepattern according to the pattern-forming method of the embodiment of the present invention.

In the step (2), the space 103 other than a space in which the prepattern is formed on the substrate is filled with the resin composition (A) containing the compound (a) which is diffusible into the prepattern, as shown in FIG. 2. Although the process for filling the resin composition (A) is not particularly limited, for example, a process of application by spin coating or the like may be exemplified. Accordingly, the space 103 other than the prepattern 102 is filled with the resin composition (A). The resin composition (A) will be described later.

Step (3)

In the step (3), the compound (a) in the resin composition (A) filling in the space 103 other than a space in which the prepattern in the step (2) is diffused into a part of the interior of the prepattern from the lateral face of the prepattern. The process for diffusing the compound (a) is preferably heating, and for example, a process in which heating is performed at a temperature of 80° C. to 200° C. with an oven, a hot plate or the like may be exemplified. The heating time may be appropriately regulated depending on the properties of the prepattern, the compound (a), and the like, but may be usually from 10 sec to 30 min, and preferably from sec to 5 min. Accordingly, the diffusion length of the compound (a) may be regulated appropriately taking into consideration the pattern width, etc., of the prepattern, and is usually 0.1 nm to 200 nm, preferably 0.5 nm to 100 nm and more preferably 1 nm to 50 nm. In this step, while diffusing the compound (a) into a part of the interior of the prepattern, residual solvent is concurrently removed when included in the resin composition (A), whereby a rigid filling (film) can be provided.

Step (4)

Figure 4:
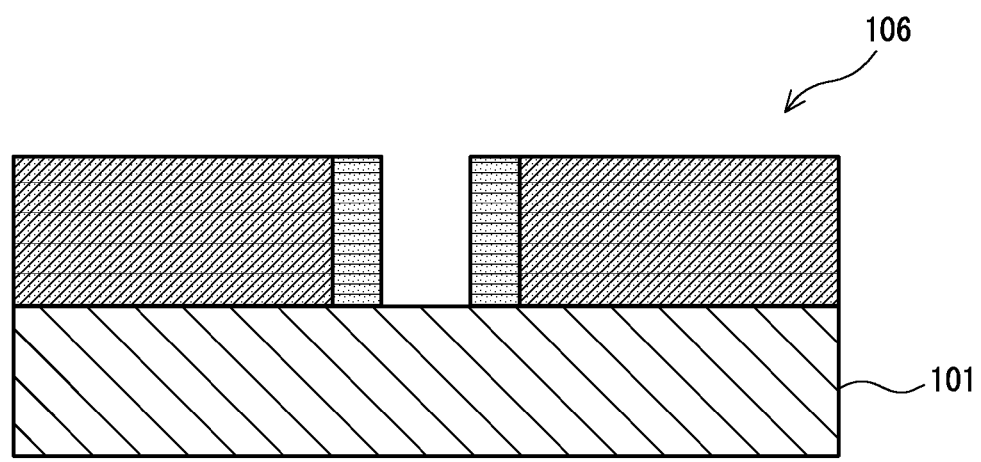
FIG. 4 shows a schematic view illustrating an example of a state achieved after removing portions in which the compound (a) is undiffused in the prepattern according to the pattern-forming method of the embodiment of the present invention.

In the step (4), portion 105 in which the compound (a) is undiffused in the prepattern are removed by treating with a removing liquid, and thus a pattern having a pattern width that is smaller than that of the prepattern is formed as shown in FIG. 4.

The removing liquid is not particularly limited as long as it is a solution having properties of: being capable of dissolving the prepattern; and preventing the portions in which the compound (a) is diffused in the prepattern and the resin composition (A) from dissolution, and thus the removing liquid may be appropriately selected depending on the properties, such as solubility, of the prepattern. The removing liquid is preferably an alkaline aqueous solution, or a solution containing an organic solvent.

Examples of the alkaline aqueous solution include alkaline aqueous solutions prepared by dissolving at least one alkaline compound such as sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene and 1,5-diazabicyclo-[4.3.0]-5-nonene.

The organic solvent in the solution containing an organic solvent is exemplified by organic solvents similar to those described later as organic solvents which may be contained in the resin composition (A). Among these, butyl acetate, 2-heptanone, propylene glycol monomethyl ether acetate, and anisole are preferred.

The content of the organic solvent in the solution containing an organic solvent is preferably 80% by mass or more, more preferably 90% by mass or more, still more preferably 95% by mass or more, and particularly preferably 100% by mass. When the content of the organic solvent falls within the above particular range, the resulting pattern can have a superior shape.

It is preferred that the present pattern-forming method further includes after the step (4) a step of patterning by etching the substrate using the obtained pattern as a mask. After completing the patterning on the substrate, the film used as a mask is removed from the substrate by a dissolution treatment or the like. Accordingly, a patterned substrate (pattern) can be finally obtained. Examples of the etching process include well-known processes such as: reactive ion etching (RIE) such as chemical dry etching and chemical wet etching; physical etching such as sputter etching and ion beam etching. The etching gas and the etching solution may be appropriately selected depending on the material of the substrate. For example, when the substrate is a silicon material, a mixed gas of Freon (chlorofluorocarbon) gas with $SF_4$, etc., may be used. Alternatively, when the substrate is a metal film, a mixed gas of $BCl_3$ with $Cl_2$, etc., may be used. Also, the pattern is suitably used in semiconductor devices, and the semiconductor devices can be broadly used in LED, solar cells and the like.

Resin Composition (A)

The resin composition (A) contains a compound (a) diffusible in the prepattern. The resin composition (A) contains in addition to the compound (a), an organic solvent, water and the like, in general. Furthermore, the resin composition (A) may contain other optional components so long as the effects of the invention are not impaired. In addition, as described above, it is necessary to use the resin composition (A) having solubility in the removing liquid used in the step (4), which is different from the solubility of the prepattern. More specifically, when the prepattern is insoluble in the removing liquid, it is necessary to use the resin composition (A) containing such a compound (a) that makes the prepattern become soluble in the removing liquid by diffusion of the compound (a). To the contrary, when the prepattern is soluble in the removing liquid, it is necessary to use the resin composition (A) containing such a compound (a) that makes the prepattern become insoluble in the removing liquid by diffusion of the compound (a). The compound (a), the solvent and other optional components are described in detail below.

Compound (a)

The compound (a) is not particularly limited as long as it is a compound diffusible in the prepattern, and diffusion of the compound into the prepattern results in alteration of the solubility in the removing liquid of the prepattern.

The compound (a) has a weight average molecular weight of preferably 20,000 or less, more preferably 10,000 or less, still more preferably 5,000 or less, and particularly preferably 3,000 or less in light of possibility of achieving an appropriate velocity of diffusion into the prepattern.

The ratio of the weight average molecular weight to the number average molecular weight of the compound (a) is preferably 1.5 or less, more preferably 1.2 or less, and still more preferably 1.1 or less. When the ratio of the weight average molecular weight to the number average molecular weight of the compound (a) is 1.5 or less, the molecule size of the compound (a) does not vary widely, and thus uniform velocity of the diffusion into the prepattern can be attained. As a result, the interface of the area in which the compound (a) is diffused and the undiffused area becomes substantially parallel to the lateral face of the prepattern, whereby the resultant pattern will have a superior shape.

Examples of the compound (a) include silsesquioxane compounds, polystyrene compounds, (meth)acrylic compounds, polyol, polyamide, polyester, polyalkylene glycol, polyhydroxyalkane, polyalkadiene, polyimide, polyolefin, polyester, polysulfide, cyclic polyolefin, polyethylene, polypropylene, polyether, polyacetal, polyurethane, polycarbonate, novolak, polysulfone, and the like. Of these, at least one compound selected from the group consisting of silsesquioxane compounds, polystyrene compounds and (meth) acrylic compounds is preferred. The aforementioned particular compounds are superior in efficiency of diffusion into the prepattern. Furthermore, when the prepattern is soluble in an alkaline removing liquid, a silsesquioxane compound or a polystyrene compound that is insoluble or hardly soluble in the alkaline removing liquid may be used as the compound (a). To the contrary, when the prepattern is insoluble in the alkaline removing liquid, and soluble in the removing liquid containing an organic solvent, a (meth)acrylic compound that is insoluble in the organic solvent may be used as the compound (a).

Examples of the silsesquioxane compound include norbornenylethylisobutyl polyhedral oligomeric silsesquioxane, trifluoropropylisobutyl polyhedral oligomeric silsesquioxane, methacrylisobutyl polyhedral oligomeric silsesquioxane, polyhydrogenated silsesquioxane, polymethylsilsesquioxane, polyethylsilsesquioxane, polypropylsilsesquioxane, polyisopropylsilsesquioxane, polybutylsilsesquioxane, poly-sec-butyl silsesquioxane, poly-tert-butylsilsesquioxane, polyphenylsilsesquioxane, polynaphthylsilsesquioxane, polystyrylsilsesquioxane, polyadamantylsilsesquioxane, and the like. Of these, norbornenylethylisobutyl polyhedral oligomeric silsesquioxane, trifluoropropylisobutyl polyhedral oligomeric silsesquioxane, and methacrylisobutyl polyhedral oligomeric silsesquioxane are preferred.

Examples of the polystyrene compound include homopolymers such as polystyrene; styrene copolymers such as styrene-butadiene copolymers, styrene-acrylonitrile copolymers and styrene-acrylonitrile-butadiene copolymers; and the like.

Examples of monomer compounds for use in synthesizing these polymers include styrene, o-methylstyrene, ethylstyrene, p-methoxystyrene, p-phenylstyrene, 2,4-dimethylstyrene, p-n-octylstyrene, p-n-decylstyrene, p-n-dodecylstyrene, and the like.

Examples of the (meth)acrylic compound include poly (meth)acrylic acids obtained by polymerizing trifluoromethyl (meth)acrylate, 2,2,2-trifluoroethyl (meth)acrylate, perfluoroethyl (meth)acrylate, perfluoro n-propyl (meth) acrylate, perfluoroisopropyl (meth)acrylate, perfluoro n-butyl (meth)acrylate, perfluoroisobutyl (meth)acrylate, perfluoro t-butyl (meth)acrylate, perfluorocyclohexyl (meth) acrylate, 2-(1,1,1,3,3,3-hexafluoro)propyl (meth)acrylate, 1-(2,2,3,3,4,4,5,5-octafluoro)pentyl (meth)acrylate, 1-(2,2,3, 3,4,4,5,5-octafluoro)hexyl (meth)acrylate, perfluorocyclohexylmethyl (meth)acrylate, 1-(2,2,3,3,3-pentafluoro)propyl (meth)acrylate, 1-(2,2,3,3,4,4,4-heptafluoro)penta (meth) acrylate, 1-(3,3,4,4,5,5,6,6,7,7,8,8,9,9,10,10,10-heptadecafluoro)decyl (meth)acrylate, 1-(5-trifluoromethyl-3,3,4,4,5,6, 6,6-octafluoro)hexyl (meth)acrylate, etc., and the like.

Solvent

The solvent contained in the resin composition (A) is not particularly limited as long as it can dissolve at least the compound (a) and the other optional components, and for example, an organic solvent such as an alcohol solvent, an ether solvent, a ketone organic solvent, an amide solvent, an ester organic solvent or a hydrocarbon solvent, water or the like may be used.

Examples of the alcohol solvent include:

monohydric alcohol solvents such as methanol, ethanol, n-propanol, i-propanol, n-butanol, i-butanol, sec-butanol, tert-butanol, n-pentanol, i-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether; and the like.

Examples of the ether solvent include diethyl ether, dipropyl ether, dibutyl ether, diphenyl ether, and the like.

Examples of the ketone solvent include ketone solvents such as acetone, methyl ethyl ketone, methyl n-propyl ketone, methyl n-butyl ketone, diethyl ketone, methyl isobutyl ketone, methyl n-pentyl ketone, ethyl-n-butyl ketone, methyl n-hexyl ketone, di-isobutyl ketone, trimethylnonanone, 2-heptanone, cyclopentanone, cyclohexanone, cycloheptanone, cyclooctanone, methylcyclohexanone, 2,4-pentanedione, acetonylacetone, and acetophenone.

Examples of the amide solvent include N,N'-dimethylimidazolidinone, N-methylformamide, N,N-dimethylformamide, N,N-diethylformamide, acetamide, N-methylacetamide, N,N-dimethylacetamide, N-methylpropionamide, N-methylpyrrolidone, and the like.

Examples of the ester solvent include diethyl carbonate, propylene carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like.

Examples of the hydrocarbon solvent include:

aliphatic hydrocarbon solvents such as n-pentane, isopentane, n-hexane, isohexane, n-heptane, isoheptane, 2,2,4-trimethyl pentane, n-octane, isooctane, cyclohexane, and methylcyclohexane;

aromatic hydrocarbon solvents such as benzene, toluene, xylene, mesitylene, ethylbenzene, trimethylbenzene, methylethylbenzene, n-propylbenzene, isopropylbenzene, diethylbenzene, isobutylbenzene, triethylbenzene, di-isopropylbenzene, n-amylnaphthalene, and anisole; and the like.

Of these, an ester solvent, a ketone solvent, an aromatic hydrocarbon solvent, or water is preferably used, and butyl acetate, propylene glycol monomethyl ether acetate, 2-heptanone, anisole and water are preferred. These solvents may be used alone, or two or more thereof may be used in combination.

Other Optional Component

The resin composition (A) may contain a surfactant as other optional component. In addition thereto, a photo acid generator, a photo base generator, a photo radical generator, a heat acid generator, a heat base generator, a heat radical generator, a crosslinking agent, a plasticizer or the like may be included.

Surfactant

When the resin composition (A) contains a surfactant, coating properties on the substrate and the like can be improved.

Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate and polyethylene glycol distearate, as well as the following commercially available products such as trade names "KP341" (Shin-Etsu Chemical Co., Ltd.), "Polyflow No. 75" and "Polyflow No. 95" (Kyoeisha Chemical Co., Ltd.), "FTOP EF301", "FTOP EF303" and "FTOP EF352" (Tohkem Products Corporation), "Megafac F171" and "Megafac F173" (Dainippon Ink And Chemicals, Incorporated), "Fluorad FC430" and "Fluorad FC431" (Sumitomo 3M Ltd.), "Asahiguard AG710", "Surflon S-382", "Surflon SC-101", "Surflon SC-102", "Surflon SC-103", "Surflon SC-104", "Surflon SC-105" and "Surflon SC-106" (Asahi Glass Co., Ltd.), and the like.

The content of the surfactant is, in light of improvement of coating properties on the substrate and the like, preferably from 0.001 parts by mass to 5 parts by mass, and more preferably from 0.001 parts by mass to 1 part by mass relative to 100 parts by mass of the resin composition (A). These surfactants may be used alone, or two or more thereof may be used in combination.

Method for Preparing Resin Composition (A)

The resin composition (A) may be prepared by, for example, mixing the compound (a) and other optional components at certain ratio in the aforementioned solvent. The resin composition (A) is generally prepared upon use thereof by dissolving the components in the solvent such that the solid content concentration becomes from 0.1% by mass to 30% by mass and preferably from 0.1% by mass to 10% by mass, and thereafter filtering through a filter having a pore size of for example, about 0.2 μm.

EXAMPLES

The present invention is explained in more detail below by way of Examples, but the present invention is not limited to these Examples. Methods of measuring each physical property values are as described below.

Weight Average Molecular Weight (Mw) and Number Average Molecular Weight (Mn)

The weight average molecular weight (Mw) and the number average molecular weight (Mn) of the polymer were measured by gel permeation chromatography (GPC) using GPC columns manufactured by Tosoh Corporation (G2000HXL×2, G3000HXL×1, and G4000HXL×1) under the following conditions.

Eluate: tetrahydrofuran (Wako Pure Chemical Industries, Ltd.)
Flow rate: 1.0 mL/min
Sample concentration: 1.0% by mass
Amount of sample injected: 100 μL
Detector: differential refractometer
Standard substance: monodisperse polystyrene Formation of Pattern Production of Substrate for Evaluation Having Prepattern An underlayer film composition (ARC66, manufactured by Brewer Science, Inc.) was spin-coated onto a 12-inch silicon wafer using CLEAN TRACK ACT8 (manufactured by Tokyo Electron Ltd.), and baked at 205° C. to form an underlayer film having a film thickness of 77 nm. ARX2928JN (manufactured by JSR Corporation) was spin-coated on the formed underlayer film, and thereafter prebaked (PB) at 120° C. for 60 sec to form a resist film having a film thickness of 60 nm. The resist film was exposed through a mask pattern using an ArF liquid immersion lithography system (NSR S610C, manufactured by Nikon Corporation) under an optical condition of: NA being 1.30; CrossPole; and σ being 0.977/0.78. The resist film was then subjected to post-exposure bake (PEB) at 115° C. for 60 sec, and thereafter developed with a 2.38% aqueous tetramethylammonium hydroxide solution at 23° C. for 30 sec, washed with water and dried to obtain a substrate for evaluation A having a positive type prepattern (40 nm line/140 nm pitch).

If necessary, this prepattern was subsequently irradiated with 254-nm ultraviolet light at 150 mJ/cm$^2$, and baked at 170° C. for 5 min to obtain a substrate for evaluation B.

Also, a substrate for evaluation C having a negative prepattern (40 nm line/140 nm pitch) was obtained by carrying out patterning in a similar manner and under similar conditions to those described above except that a mask having a reverse pattern from the above mask pattern with respect to light-transmitted parts and light-shielded parts was used, and that the development was performed with butyl acetate.

Further, a substrate for evaluation D having a negative prepattern (55 nm pillar/110 nm pitch) was obtained by carrying out patterning in a similar manner and under similar conditions to those described above except that the mask layout was changed.

Example 1

A 0.9% by mass solution of norbornenylethylisobutyl polyhedral oligomeric silsesquioxane (a-1: Mw=937.68) in butyl acetate was prepared. Thus resulting solution was filtered through a filter having a pore size of 0.2 μm to obtain a composition. The composition was spin-coated on the substrate for evaluation B (3,000 rpm/30 sec), and heated on a hot plate at 120° C. for 60 sec. Subsequently, a removal treatment was carried out with a 0.23% aqueous tetramethylammonium hydroxide solution at 23° C. for 60 sec, followed by washing with water, and drying.

Example 2

A 0.9% by mass solution of trifluoropropylisobutyl polyhedral oligomeric silsesquioxane (a-2: Mw=913.54) in butyl acetate was prepared. Thus resulting solution was filtered through a filter having a pore size of 0.2 μm to obtain a composition. The composition was spin-coated on the substrate for evaluation B (3,000 rpm/30 sec), and annealed on a hot plate at 120° C. for 60 sec. Subsequently, a removal treatment was carried out with a 0.23% aqueous tetramethylammonium hydroxide solution at 23° C. for 60 sec, followed by washing with water, and drying.

Example 3

A 0.9% by mass solution of methacrylisobutyl polyhedral oligomeric silsesquioxane (a-3: Mw=943.64) in butyl acetate was prepared. Thus resulting solution was filtered through a filter having a pore size of 0.2 μm to obtain a composition. The composition was spin-coated on the substrate for evaluation B (3,000 rpm/30 sec), and annealed on a hot plate at 120° C. for 60 sec. Subsequently, a removal treatment was carried out with a 0.23% aqueous tetramethylammonium hydroxide solution at 23° C. for 60 sec, followed by washing with water, and drying.

Example 4

A 0.9% by mass solution of monodisperse polystyrene (a-4: Mw=2,800, Mw/Mn=1.04) in butyl acetate was prepared. Thus resulting solution was filtered through a filter having a pore size of 0.2 μm to obtain a composition. The composition was spin-coated on the substrate for evaluation B (3,000 rpm/sec), and annealed on a hot plate at 120° C. for 60 sec. Subsequently, a removal treatment was carried out with a 0.23% aqueous tetramethylammonium hydroxide solution at 23° C. for 60 sec, followed by washing with water, and drying.

Example 5

A 0.9% by mass solution of a compound represented by the following formula (a-5: Mw=1,716) in butyl acetate was prepared. Thus resulting solution was filtered through a filter having a pore size of 0.2 μm to obtain a composition. The composition was spin-coated on the substrate for evaluation B (3,000 rpm/30 sec), and annealed on a hot plate at 120° C. for 60 sec. Subsequently, a removal treatment was carried out with a 0.23% aqueous tetramethylammonium hydroxide solution at 23° C. for 60 sec, followed by washing with water, and drying.

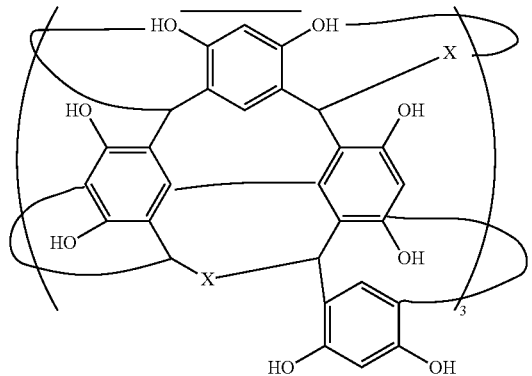

Example 6

A 0.6% by mass aqueous solution of monodisperse polymethacrylic acid (a-6: Mw=3,100, Mw/Mn=1.09) was prepared. Thus resulting solution was filtered through a filter having a pore size of 0.2 μm to obtain a composition. The composition was spin-coated on the substrate for evaluation A (3,000 rpm/30 sec), and annealed on a hot plate at 160° C. for 60 sec. Subsequently, a removal treatment was carried out with butyl acetate at 23° C. for 60 sec, followed by washing with water, and drying.

Example 7

A 0.9% by mass solution of monodisperse polystyrene (a-4: Mw=2,800, Mw/Mn=1.04) in butyl acetate was prepared. Thus resulting solution was filtered through a filter having a pore size of 0.2 μm to obtain a composition. The composition was spin-coated on the substrate for evaluation C (3,000 rpm/sec), and annealed on a hot plate at 120° C. for 60 sec. Subsequently, a removal treatment was carried out with a 0.23% aqueous tetramethylammonium hydroxide solution at 23° C. for 60 sec, followed by washing with water, and drying.

Example 8

A 0.9% by mass solution of monodisperse polystyrene (a-4: Mw=2,800, Mw/Mn=1.04) in butyl acetate was prepared. Thus resulting solution was filtered through a filter having a pore size of 0.2 μm to obtain a composition. The composition was spin-coated on the substrate for evaluation D (3,000 rpm/sec), and annealed on a hot plate at 120° C. for 60 sec. Subsequently, a removal treatment was carried out with a 0.23% aqueous tetramethylammonium hydroxide solution at 23° C. for 60 sec, followed by washing with water, and drying.

Comparative Example 1

A 0.9% by mass solution of monodisperse polystyrene (a-7: Mw=75,000, Mw/Mn=1.11) in butyl acetate was prepared. Thus resulting solution was filtered through a filter having a pore size of 0.2 μm to obtain a composition. The composition was spin-coated on the substrate for evaluation B (3,000 rpm/sec), and annealed on a hot plate at 120° C. for 60 sec. Subsequently, a removal treatment was carried out with a 0.23% aqueous tetramethylammonium hydroxide solution at 23° C. for 60 sec, followed by washing with water, and drying.

Evaluation

The following evaluations were made on patterns formed as described in the foregoing. The results are shown in Table 1.

Critical Dimension (CD)

The trench widths obtained according to the aforementioned pattern-forming method were measured at 30 sites in total, and the averages of the measurements at the 30 sites were determined as CD (nm). For the measurement of the trench width, a measuring SEM (Scanning Electron Microscope; S9220, manufactured by Hitachi, Ltd.) was used.

TABLE 1

| | Resin composition filling in area other than prepattern (Component (a)) | | | | | |
|---|---|---|---|---|---|---|
| | Component (a) | | | | Developing | CD |
| | Type | Mw | Mw/Mn | Solvent | solution | (nm) |
| Example 1 | a-1 | 938 | — | butyl acetate | TMAH | 18.4 |
| Example 2 | a-2 | 914 | — | butyl acetate | TMAH | 19.1 |
| Example 3 | a-3 | 944 | — | butyl acetate | TMAH | 22.6 |
| Example 4 | a-4 | 2,800 | 1.04 | butyl acetate | TMAH | 25.5 |
| Example 5 | a-5 | 1,716 | — | butyl acetate | TMAH | 23.3 |
| Example 6 | a-6 | 3,100 | 1.09 | water | butyl acetate | 30.9 |
| Example 7 | a-4 | 2,800 | 1.04 | butyl acetate | TMAH | 26.4 |
| Example 8 | a-4 | 2,800 | 1.04 | butyl acetate | TMAH | 31.0 |
| Comparative Example 1 | a-7 | 75,000 | 1.11 | butyl acetate | TMAH | 38.9 |

As compared with Comparative Example 1 in which a resin composition containing the compound (a-7) which could not be diffused into the prepattern due to having a great molecular weight was used, Examples 1 to 8 according to the resist pattern-forming method of the embodiment of the present invention were able to form patterns having a smaller width as shown in Table 1, and thus formation of finer patterns was enabled.

According to a novel pattern-forming method of the embodiment of the present invention, formation of finer patterns as compared with those formed by a conventional pattern-forming method is enabled. Therefore, the pattern-forming method of the embodiment of the present invention can be suitably used for forming resist patterns in lithography process of various types of electronic devices such as semiconductor devices, liquid crystal devices, etc., that necessitate further miniaturization.

Obviously, numerous modifications and variations of the present invention are possible in light of the above teachings. It is therefore to be understood that within the scope of the appended claims, the invention may be practiced otherwise than as specifically described herein.

What is claimed is:

1. A pattern-forming method comprising:
   providing a resist film on a substrate;
   exposing the resist film selectively to form a more-polar site and a less-polar site in the resist film, the more-polar site being more polar than the less-polar site and being generated by an exposure to light;
   removing the less-polar site and leaving the more-polar site using a developing solution comprising an organic solvent to form a prepattern on the substrate;
   filling a space other than a space in which the prepattern is formed on the substrate with a resin composition, the resin composition containing a solvent which is an organic solvent, and a compound which is diffusible into the prepattern;
   diffusing the compound into a part of the prepattern; and
   removing portions in which the compound is undiffused in the prepattern using a removing liquid to make a pattern using the part of the prepattern.

2. The pattern-forming method of claim 1, wherein the removing liquid is an alkaline aqueous solution.

3. The pattern-forming method of claim 1, wherein the removing liquid includes an organic solvent.

4. The pattern-forming method of claim 1, wherein the compound is diffused by heating.

5. The pattern-forming method of claim 1, wherein the compound has a weight average molecular weight of 20,000 or less.

6. The pattern-forming method of claim 1, wherein a ratio of a weight average molecular weight of the compound to a number average molecular weight of the compound is 1.5 or less.

7. The pattern-forming method of claim 1, wherein the compound includes a silsesquioxane compound, a polystyrene compound, a (meth)acrylic compound or a mixture thereof.

8. The pattern-forming method of claim 1, wherein the prepattern is a line-and-space pattern or a pillar pattern.

* * * * *